(12) United States Patent
Hatakeyama et al.

(10) Patent No.: US 6,864,037 B2
(45) Date of Patent: Mar. 8, 2005

(54) POLYMERS, RESIST COMPOSITIONS AND PATTERNING PROCESS

(75) Inventors: Jun Hatakeyama, Niigata-ken (JP); Yuji Harada, Niigata-ken (JP); Yoshio Kawai, Niigata-ken (JP); Masaru Sasago, Osaka (JP); Masayuki Endo, Osaka (JP); Shinji Kishimura, Hyogo-ken (JP); Michitaka Ootani, Saitama-ken (JP); Satoru Miyazawa, Saitama-ken (JP); Kentaro Tsutsumi, Saitama-ken (JP); Kazuhiko Maeda, Tokyo (JP)

(73) Assignees: Shin-Etsu Chemical Co., Ltd., Tokyo (JP); Matsushita Electric Industrial Co. Ltd., Osaka (JP); Central Glass Co., Ltd., Yamaguchi-ken (JP)

( * ) Notice: Subject to any disclaimer, the term of this patent is extended or adjusted under 35 U.S.C. 154(b) by 84 days.

(21) Appl. No.: 10/178,237

(22) Filed: Jun. 25, 2002

(65) Prior Publication Data

US 2003/0082479 A1 May 1, 2003

(30) Foreign Application Priority Data

Jun. 25, 2001 (JP) ........................................ 2001-190680

(51) Int. Cl.$^7$ ............................ G03F 7/038; G03F 7/40; G03F 7/38; G03C 1/492
(52) U.S. Cl. .................... 430/270.1; 430/330; 430/907; 430/910; 526/242; 526/282; 526/319; 524/558
(58) Field of Search .............................. 430/270.1, 330, 430/907, 910; 526/242, 282, 319; 524/558

(56) References Cited

U.S. PATENT DOCUMENTS

| 4,491,628 A | 1/1985 | Ito et al. | |
|---|---|---|---|
| 5,310,619 A | 5/1994 | Crivello et al. | |
| 6,509,134 B2 * | 1/2003 | Ito et al. | 430/270.1 |
| 6,511,787 B2 * | 1/2003 | Harada et al. | 430/270.1 |
| 6,537,726 B2 * | 3/2003 | Nakanishi et al. | 430/270.1 |
| 6,548,219 B2 * | 4/2003 | Ito et al. | 430/270.1 |
| 6,610,456 B2 * | 8/2003 | Allen et al. | 430/270.1 |
| 2003/0022100 A1 * | 1/2003 | Lee et al. | 430/270.1 |
| 2003/0031952 A1 * | 2/2003 | Harada et al. | 430/270.1 |
| 2003/0031953 A1 * | 2/2003 | Hatakeyama et al. | 430/270.1 |

FOREIGN PATENT DOCUMENTS

| JP | A 9-73173 | 3/1987 |
|---|---|---|
| JP | B 2-27660 | 6/1990 |
| JP | A 63/27829 | 11/1994 |
| JP | A 9-43848 | 2/1997 |
| JP | A 9-230595 | 9/1997 |
| JP | A 10-10739 | 1/1998 |
| WO | 97/33198 | 9/1997 |

OTHER PUBLICATIONS

Ito et al., "Polymer design for 157 nm chemically amplified resists," Proc. SPIE vol. 4345 (2001).
Ito et al., "Polymerization of Methyl–α–(Trifluoromethyl)acrylate and α–(Trifluoromethyl)acrylonitrile and Copolymerization of These Monomers with Methyl Methacrylate," Macromolecules, vol. 25, No. 3, (1982) 915–920.

* cited by examiner

Primary Examiner—Yvette C. Thornton
(74) Attorney, Agent, or Firm—Millen, White, Zelano & Branigan, P.C.

(57) ABSTRACT

A copolymer of an acrylic monomer having at least one $C_{6-20}$ alicyclic structure with a norbornene derivative or styrene monomer having a hexafluoroalcohol pendant is highly transparent to VUV radiation and resistant to plasma etching. A resist composition using the polymer as a base resin is sensitive to high-energy radiation below 200 nm, has excellent sensitivity, transparency and dry etching resistance, and is suited for lithographic microprocessing.

18 Claims, No Drawings

POLYMERS, RESIST COMPOSITIONS AND PATTERNING PROCESS

This invention relates to polymers useful as the base resin in resist compositions suited for microfabrication. It also relates to resist compositions, especially chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography. Also, the change-over from i-line (365 nm) to shorter wavelength KrF laser (248 nm) brought about a significant innovation. Resist materials adapted for KrF excimer lasers enjoyed early use on the 0.3 micron process, passed through the 0.25 micron rule, and currently entered the mass production phase on the 0.18 micron rule. Engineers have started investigation on the 0.15 micron rule, with the trend toward a finer pattern rule being accelerated.

For ArF laser (193 nm), it is expected to enable miniaturization of the design rule to 0.13 $\mu$m or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 $\mu$m or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings offers a transmittance nearly on a practically acceptable level. However, this base polymer was found to turn to be negative upon exposure to high-energy radiation as from an $F_2$ laser, interfering with its use as a practical resist. In contrast, those polymers obtained by introducing fluorine into acrylic resins or polymers containing in their backbone an alicyclic compound originating from a norbornene derivative were found to be suppressed in absorption and overcome the negative turning problem.

It was recently reported that copolymers of t-butyl $\alpha$-trifluoromethylacrylate with 5-(2-hydroxy-2,2-bistrifluoromethyl)ethyl-2-norbornene and copolymers of t-butyl $\alpha$-trifluoromethylacrylate with 3-(hydroxybistrifluoromethyl)methylstyrene are suited to form resists having high dry etching resistance and high transparency (SPIE 2001, Vol. 4345–31; Polymer design for 157-nm chemically amplified resists). However, these copolymers have an absorbance of the order of 2 to 3, and the resist pattern reported in the article merely has a thickness of about 1,000 Å. A further improvement in transmittance is necessary. It is generally believed that an absorbance of no more than 2 is necessary in order to produce rectangular patterns at a thickness of 2,000 Å or greater. Heretofore, the resist material capable of satisfying all the requirements including dry etching resistance, alkali solubility, adhesion and transparency is not available in the art.

In order to process the underlying substrate through a very thin film resist pattern having a thickness in the range of 1,000 to 1,500 Å, the resist material must have very high resistance to etching.

The polymers of $\alpha$-trifluoromethylacrylic acid derivatives, whose polymerization method is described in A.C.S. Macromolecules, 1982, 15, 915–920, have been under study as the resist of the backbone decomposition type adapted for electron beam exposure.

JP-A 9-43848 discloses $\alpha$-trifluoromethylacrylates having a cyclic structure, which serve as non-chemically amplified resists of the backbone decomposition type.

SUMMARY OF THE INVENTION

An object of the invention is to provide a novel polymer having not only a high transmittance to vacuum ultraviolet radiation of up to 300 nm, especially $F_2$ (157 nm), $Kr_2$ (146 nm), KrAr (134 nm) and $Ar_2$ (126 nm) laser beams, but also improved etching resistance, and useful as the base resin in a resist composition. Another object is to provide a resist composition, and especially a chemical amplification resist composition, comprising the polymer, and a patterning process using the same.

It is noteworthy that a copolymer of an $\alpha$-trifluoromethylacrylic acid derivative in ester form having an acid-eliminatable cyclic structure with a cycloolefinic or styrenic monomer having a hexafluoroalcohol pendant is promising as a positive working resist because the copolymer becomes alkali soluble in the presence of an acid as a result of the ester moiety being eliminated with the acid. It has been found that using as the base polymer a copolymer of a monomer having at least one cycloaliphatic structure of 6 to 20 carbon atoms, selected from among acrylate monomers having fluorine at $\alpha$-position, with a norbornene derivative or hexafluoroisopropanol styrene, a resist composition, especially a chemically amplified resist composition, having a drastically improved transparency as well as dry etching resistance is obtained.

In a first aspect, the invention provides a polymer comprising recurring units of the following general formulae (1m) and (1n).

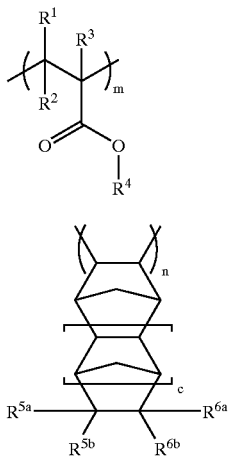
(1m)

(1n)

Herein $R^1$ and $R^2$ each are hydrogen, a fluorine atom or a straight, branched or cyclic alkyl or fluorinated alkyl group of 1 to 20 carbon atoms; $R^3$ is a fluorine atom or a straight, branched or cyclic fluorinated alkyl group of 1 to 20 carbon atoms; and $R^4$ is an acid labile group of 6 to 20 carbon atoms having at least one cyclic structure. $R^{5a}$, $R^{5b}$, $R^{6a}$ and $R^{6b}$ are each independently an adhesive group, hydrogen, a hydroxyl group, a carboxyl group, a straight, branched or cyclic alkyl or fluorinated alkyl group of 1 to 20 carbon atoms, $(CH_2)_dCO_2R^7$ or $(CH_2)_dC(R^8)_2(OR^7)$, or any two of carbon atom or atoms to which they are attached; $R^7$ is an acid labile group, an adhesive group, hydrogen or a straight, branched or cyclic alkyl or fluorinated alkyl group of 1 to 20 carbon atoms; $R^8$ is independently hydrogen, a fluorine atom or a straight, branched or cyclic fluorinated alkyl group of 1 to 20 carbon atoms; m and n each are a number from more than 0 to less than 1, and $0<m+n\leq1$, c is 0 or 1, and d is an integer of 0 to 6.

In a second aspect, the invention provides a polymer comprising recurring units of the following general formulae (1m) and (1p).

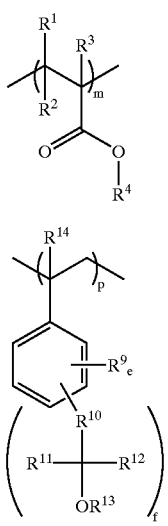

(1m)

(1p)

Herein $R^1$ to $R^4$ are as defined above; $R^9$ is hydrogen, a fluorine atom or a straight, branched or cyclic alkyl or fluorinated alkyl group of 1 to 20 carbon atoms; $R^{10}$ is a single bond or a divalent hydrocarbon group of 1 to 4 carbon atoms; $R^{11}$ and $R^{12}$ are each independently hydrogen, a fluorine atom or a straight, branched or cyclic alkyl or fluorinated alkyl group of 1 to 4 carbon atoms, at least either one of $R^{11}$ and $R^{12}$ contains at least one fluorine atom; $R^{13}$ is hydrogen, a straight, branched or cyclic alkyl group of 1 to 10 carbon atoms or an acid labile group; $R^{14}$ is hydrogen, a fluorine atom or a straight or branched alkyl or fluorinated alkyl group of 1 to 4 carbon atoms; m and p each are a number from more than 0 to less than 1, and $0<m+p<1$, e is an integer of 0 to 4, and f is an integer of 1 to 3.

Preferably, $R^3$ is a straight, branched or cyclic fluorinated alkyl group of 1 to 20 carbon atoms and most preferably trifluoromethyl.

In a third aspect, the invention provides a resist composition comprising the polymer, and preferably a chemically amplified resist composition comprising (A) the polymer, (B) an organic solvent, (C) a photoacid generator, and optionally, (D) a basic compound and/or (E) a dissolution inhibitor.

In a fourth aspect, the invention provides a process for forming a resist pattern comprising the steps of applying the resist composition onto a substrate to form a coating; heat treating the coating and then exposing it to high-energy radiation in a wavelength band of 100 to 180 nm or 1 to 30 nm through a photo mask; and optionally heat treating the exposed coating and developing it with a developer. The high-energy radiation is typically an $F_2$ laser beam, $Ar_2$ laser beam or soft x-ray.

DESCRIPTION OF THE PREFERRED EMBODIMENTS

Polymer

The polymers or high molecular weight compounds of the invention include recurring units of the following general formula (1m) and recurring units of the following general formula (1n) or (1p). These copolymers of an acrylate monomer having a fluorinated alkyl group at α-position and a cycloaliphatic structure with a norbornene derivative or hexafluoroisopropanol styrene offer high transparency at a wavelength in proximity to 157 nm and have excellent dry etching resistance.

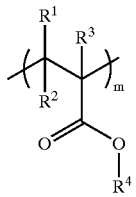

(1m)

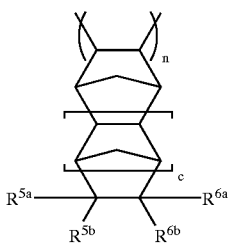

(1n)

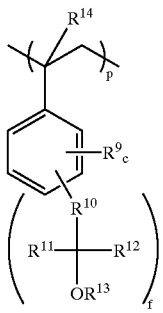

(1p)

In formula (1m), $R^1$ and $R^2$ each are hydrogen, a fluorine atom or a straight, branched or cyclic alkyl or fluorinated alkyl group of 1 to 20 carbon atoms, preferably 1 to 12 carbon atoms; $R^3$ is a fluorine atom or a straight, branched or cyclic fluorinated alkyl group of 1 to 20 carbon atoms, preferably 1 to 12 carbon atoms; and $R^4$ is an acid labile group of 6 to 20 carbon atoms having at least one cyclic structure. In formula (1n), $R^{5a}$, $R^{5b}$, $R^{6a}$ and $R^{6b}$ are each independently an adhesive group, hydrogen, a hydroxyl group, a carboxyl group, a straight, branched or cyclic alkyl or fluorinated alkyl group of 1 to 20 carbon atoms, preferably 1 to 12 carbon atoms, $(CH_2)_d CO_2 R^7$ or $(CH_2)_d C(R^8)_2 (OR^7)$, or any two of $R^{5a}$, $R^{5b}$, $R^{6a}$ and $R^{6b}$ may bond together to form a ring with the carbon atom or atoms to which they are attached; $R^7$ is an acid labile group, an adhesive group, hydrogen or a straight, branched or cyclic alkyl or fluorinated alkyl group of 1 to 20 carbon atoms, preferably 1 to 12 carbon atoms; and $R^8$ is independently hydrogen, a fluorine atom or a straight, branched or cyclic fluorinated alkyl group of 1 to 20 carbon atoms, preferably 1 to 12 carbon atoms. Letters m and n each are a number from more than 0 to less than 1, and $0<m+n\leq 1$, c is 0 or 1, and d is an integer of 0 to 6.

In formula (1p), $R^9$ is hydrogen, a fluorine atom or a straight, branched or cyclic alkyl or fluorinated alkyl group of 1 to 20 carbon atoms, preferably 1 to 12 carbon atoms; $R^{10}$ is a single bond or a divalent hydrocarbon group of 1 to 4 carbon atoms; $R^{11}$ and $R^{12}$ are each independently hydrogen, a fluorine atom or a straight, branched or cyclic alkyl or fluorinated alkyl group of 1 to 4 carbon atoms, either one or both of $R^{11}$ and $R^{12}$ contain at least one fluorine atom; $R^{13}$ is hydrogen, a straight, branched or cyclic alkyl group of 1 to 10 carbon atoms or an acid labile group; and $R^{14}$ is hydrogen, a fluorine atom or a straight or branched alkyl or fluorinated alkyl group of 1 to 4 carbon atoms. Letters m and p each are a number from more than 0 to less than 1, and $0<m+p\leq 1$, e is an integer of 0 to 4, and f is an integer of 1 to 3.

Suitable straight, branched or cyclic alkyl groups are of 1 to 20 carbon atoms, preferably 1 to 12 carbon atoms, especially 1 to 10 carbon atoms and include, but are not limited to, methyl, ethyl, propyl, isopropyl, n-butyl, sec-butyl, tert-butyl, cyclopentyl, cyclohexyl, 2-ethylhexyl, and n-octyl. Suitable fluorinated alkyl groups correspond to the foregoing alkyl groups in which some or all of the hydrogen atoms are substituted with fluorine atoms, and include, for example, trifluoromethyl, 2,2,2-trifluoroethyl, 3,3,3-trifluoropropyl, 1,1,1,3,3,3-hexafluoroisopropyl, 1,1,2,2,3,3, 3-heptafluoropropyl, and 2,2,3,3,4,4,5,5-octafluoropentyl. Groups of the following formulae are also useful.

Herein, R is hydrogen, a fluorine atom, a straight, branched or cyclic alkyl or fluorinated alkyl group of 1 to 20 carbon atoms, and g is a number of 0 to 10.

The divalent hydrocarbon groups represented by $R^{10}$ include alkylene groups.

The acid labile groups represented by $R^4$ are selected from a variety of such groups, as long as they contain 6 to 20 carbon atoms in total and have at least one cyclic structure as shown by the general formula (AL-1) below wherein the total of carbon atoms in $R^{16}$, $R^{17}$ and $R^{18}$ is 6 to 20. The cyclic structure may be a monocyclic structure although a bridged cyclic structure is preferred because it can further improve the etching resistance. The acid-eliminatable group having a cyclic structure introduced therein has high elimination reactivity and is able to enhance the contrast or γ of dissolution.

(AL-1)

$$\begin{array}{c} R^{15} \\ | \\ -\!\!-\!\!-\!\!R^{17} \\ | \\ R^{16} \end{array}$$

Herein, $R^{16}$, $R^{17}$ and $R^{18}$ which may be the same or different are selected from monovalent hydrocarbon groups, typically straight, branched or cyclic alkyl groups of 1 to 30 carbon atoms, preferably 1 to 12 carbon atoms, and bridged cyclic hydrocarbon groups. A pair of $R^{15}$ and $R^{16}$, $R^{16}$ and $R^{17}$, or $R^{15}$ and $R^{17}$, taken together, may form a ring of 3 to 16 carbon atoms, especially 4 to 14 carbon atoms, with the carbon atom to which they are attached. Exemplary acid labile groups are shown below.

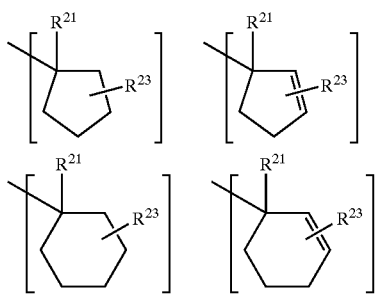

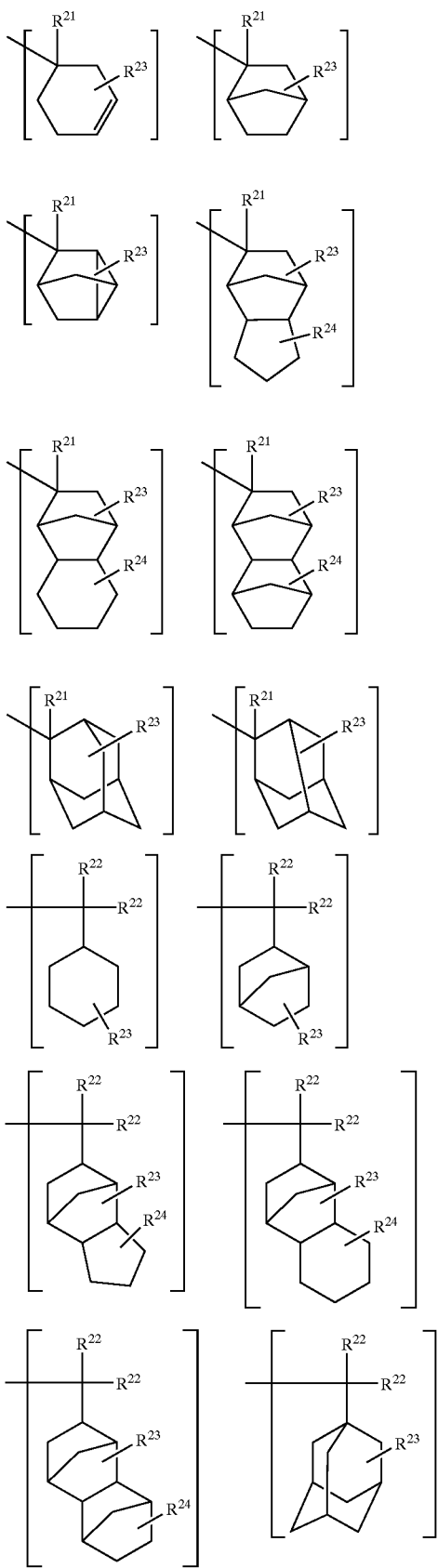

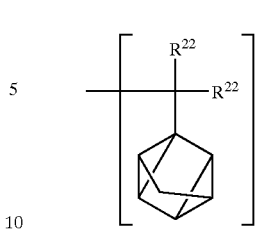

Herein, $R^{21}$ and $R^{22}$ each are a monovalent hydrocarbon group, typically a straight, branched or cyclic alkyl group of 1 to 6 carbon atoms which may contain a hetero atom. The hetero atom is typically selected from oxygen, sulfur and nitrogen atoms. The hetero atom is contained or intervenes in the form of —OH, —OR$^{25}$, —O—, —S—, —S(=O)—, —NH$_2$, —NHR$^{25}$, —N(R$^{25}$)$_2$, —NH— or —NR$^{25}$—. $R^{23}$ and $R^{24}$ each are hydrogen, hydroxyl or a straight, branched or cyclic alkyl or alkoxy group of 1 to 6 carbon atoms which may contain a hetero atom. $R^{25}$ is a straight, branched or cyclic alkyl group of 1 to 10 carbon atoms.

Illustrative examples of $R^{21}$ and $R^{22}$ include methyl, ethyl, propyl, isopropyl, n-butyl, sec-butyl, n-pentyl, n-hexyl, cyclopropyl, cyclopropylmethyl, cyclobutyl, cyclopentyl, and cyclohexyl. Illustratively, $R^{23}$ and $R^{24}$ are hydrogen, hydroxyl, straight, branched or cyclic alkyl, hydroxyalkyl, alkoxyalkyl and alkoxy groups of 1 to 6 carbon atoms, especially 1 to 5 carbon atoms, examples of which include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

When $R^7$ and $R^{13}$ are acid labile groups, they may be acid labile groups of formula (AL-1) or acid labile groups of the following general formula (AL-10) and (AL-11).

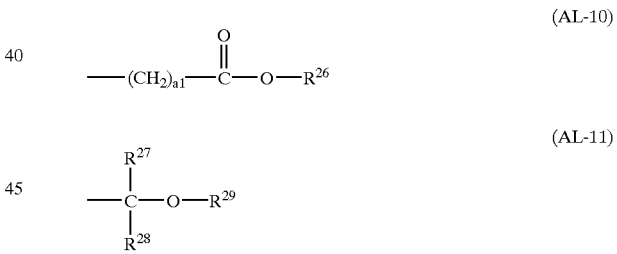

In formula (AL-10), $R^{26}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms or a group of above formula (AL-1). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. Letter a1 is an integer of 0 to 6.

In formula (AL-11), $R^{27}$ and $R^{28}$ are hydrogen or straight, branched or cyclic alkyl groups of 1 to 18 carbon atoms, preferably 1 to 10 carbon atoms, such as, for example, methyl, ethyl, propyl, isopropyl, n-butyl, sec-butyl, tert-butyl, cyclopentyl, cyclohexyl, 2-ethylhexyl and n-octyl.

$R^{29}$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Exemplary substituted alkyl groups are shown below.

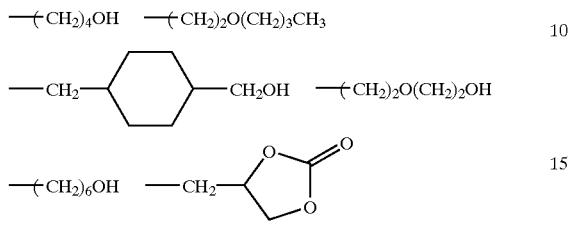

A pair of $R^{27}$ and $R^{28}$, a pair of $R^{27}$ and $R^{29}$, or a pair of $R^{28}$ and $R^{29}$ may form a ring. Each of $R^{27}$, $R^{28}$ and $R^{29}$ is a straight or branched alkylene group of 1 to 18 carbon atoms, preferably 1 to 10 carbon atoms, when they form a ring.

Illustrative, non-limiting, examples of the acid labile group of formula (AL-10) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Substituents of the following formulae (AL-10)-1 through (AL-10)-9 are also useful.

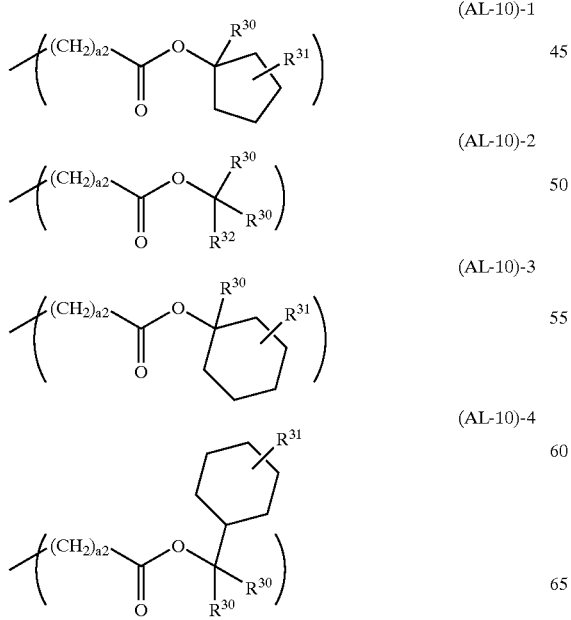

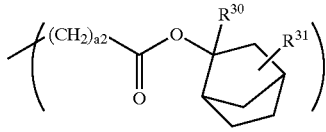
(AL-10)-5

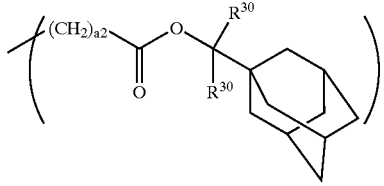
(AL-10)-6

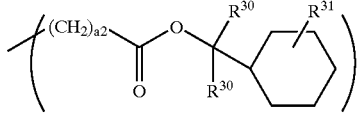
(AL-10)-7

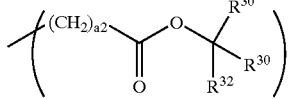
(AL-10)-8

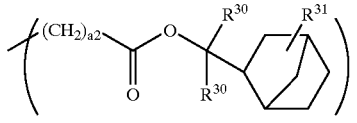
(AL-10)-9

Herein, a2 is an integer of 0 to 6. $R^{30}$ which may be the same or different is a straight, branched or cyclic $C_{1-8}$ alkyl group or an $C_{6-20}$ aryl or aralkyl group. $R^{31}$ is hydrogen or a straight, branched or cyclic $C_{1-20}$ alkyl group. $R^{32}$ is a straight, branched or cyclic $C_{2-20}$ alkyl group or an $C_{6-20}$ aryl or aralkyl group.

Of the acid labile groups of formula (AL-11), straight or branched ones are exemplified by those of the following formulae (AL-11)-1 through (AL-11)-23.

—CH$_2$—O—CH$_3$ (AL-11)-1

—CH$_2$—O—CH$_2$—CH$_3$ (AL-11)-2

—CH$_2$—O—(CH$_2$)$_2$—CH$_3$ (AL-11)-3

—CH$_2$—O—(CH$_2$)$_3$—CH$_3$ (AL-11)-4

$$-CH_2-O-\underset{CH_3}{\underset{|}{CH}}-CH_3$$ (AL-11)-5

$$-CH_2-O-\underset{CH_3}{\overset{CH_3}{\underset{|}{\overset{|}{C}}}}-CH_3$$ (AL-11)-6

$$-\underset{CH_3}{\underset{|}{CH}}-O-CH_3$$ (AL-11)-7

$$-\underset{\underset{CH}{\overset{CH_2}{\overset{|}{CH_2}}}}{\overset{CH_3}{\underset{|}{\phantom{C}}}}-O-CH_3$$ (AL-11)-8

(AL-11)-9 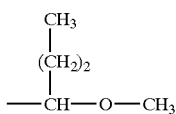

(AL-11)-10 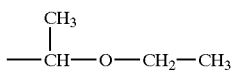

(AL-11)-11 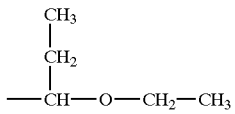

(AL-11)-12 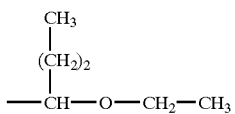

(AL-11)-13 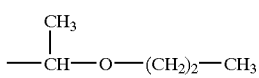

(AL-11)-14 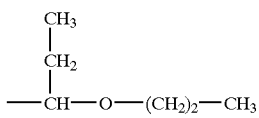

(AL-11)-15 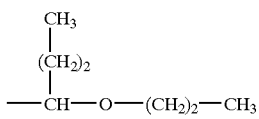

(AL-11)-16 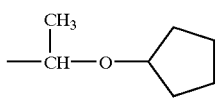

(AL-11)-17 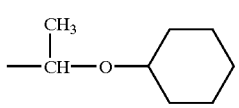

(AL-11)-18 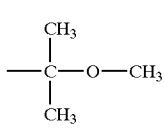

(AL-11)-19 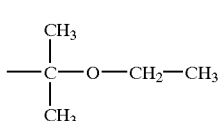

(AL-11)-20 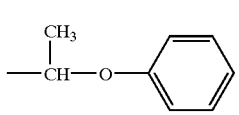

(AL-11)-21 

(AL-11)-22 

(AL-11)-23 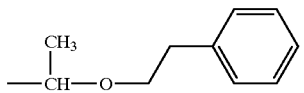

Of the acid labile groups of formula (AL-11), cyclic ones are exemplified by tetrahydrofuran-2-yl, 2-methyltetrahydrofuran-2-yl, tetrahydropyran-2-yl, and 2-methyltetrahydropyran-2-yl.

In an alternative embodiment, the polymer may be crosslinked within the molecule or between molecules with an acid labile group of the general formula (AL-11a) or (AL-11b).

(AL-11a)
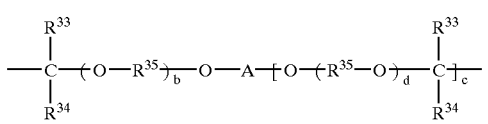

(AL-11b)
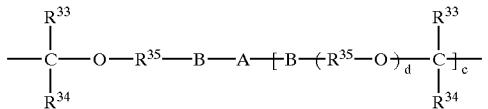

Herein $R^{33}$ and $R^{34}$ each are hydrogen or a straight, branched or cyclic alkyl group of 1 to 8 carbon atoms, or $R^{33}$ and $R^{34}$, taken together, may form a ring, and $R^{33}$ and $R^{34}$ are straight or branched alkylene groups of 1 to 8 carbon atoms when they form a ring; $R^{35}$ is a straight, branched or cyclic alkylene group of 1 to 10 carbon atoms; "b" and "d" are 0 or integers of 1 to 10, and preferably 0 or integers of 1 to 5; "c" is an integer of 1 to 7; "A" is a (c+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The letter "c" is preferably an integer of 1 to 3.

The crosslinking acetal groups of formulae (AL-11a) and (AL-11b) are exemplified by the following formulae (AL-11)-24 through (AL-11)-31.

(AL-11)-24 
(AL-11)-25 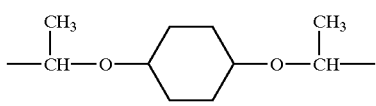
(AL-11)-26 
(AL-11)-27 
(AL-11)-28 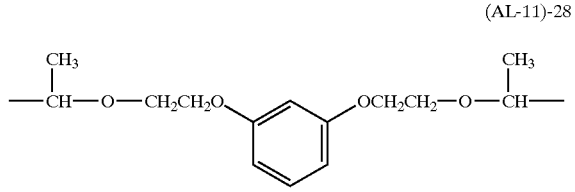
(AL-11)-29 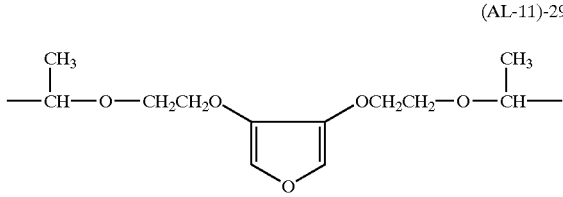
(AL-11)-30 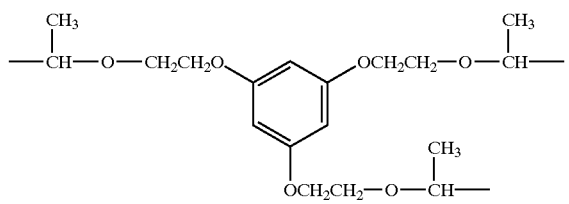
(AL-11)-31 
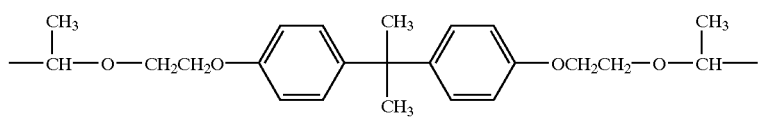
Referring to formula (1n) again, any two of $R^{5a}$, $R^{5b}$, $R^{6a}$ and $R^{6b}$ may bond together to form a ring with the carbon atom or atoms to which they are attached, the ring having 3 to 20 carbon atoms, especially 3 to 16 carbon atoms. Illustrative examples of formula (1n) in this embodiment are given below.
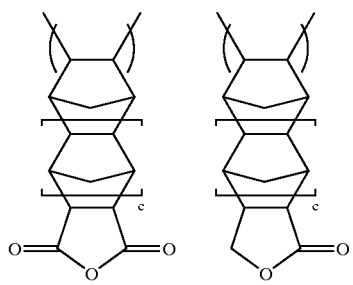
-continued
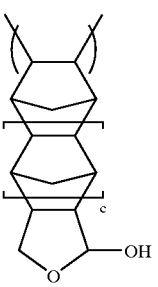
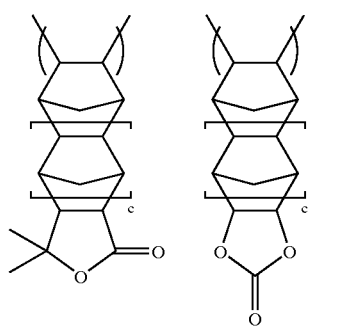
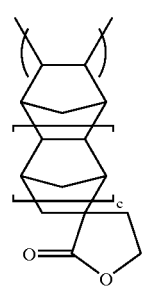

-continued
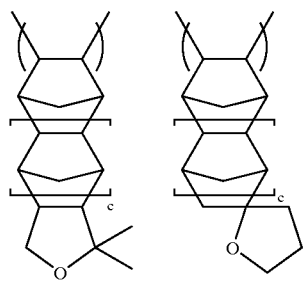
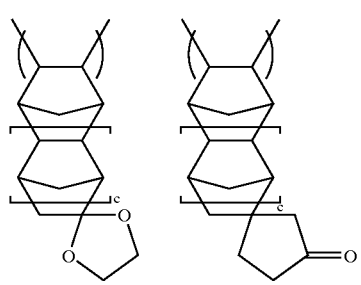
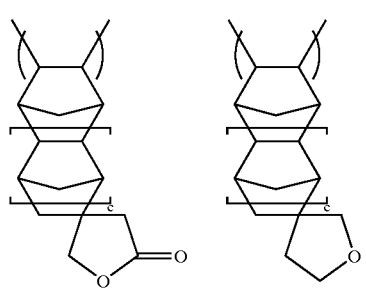
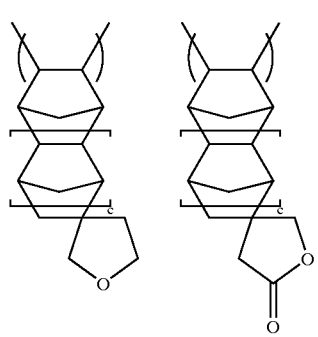
Where $R^{5a}$, $R^{5b}$, $R^{6a}$ and $R^{6b}$ are adhesive groups, they are selected from a variety of such groups, and preferably groups of the following formulae.
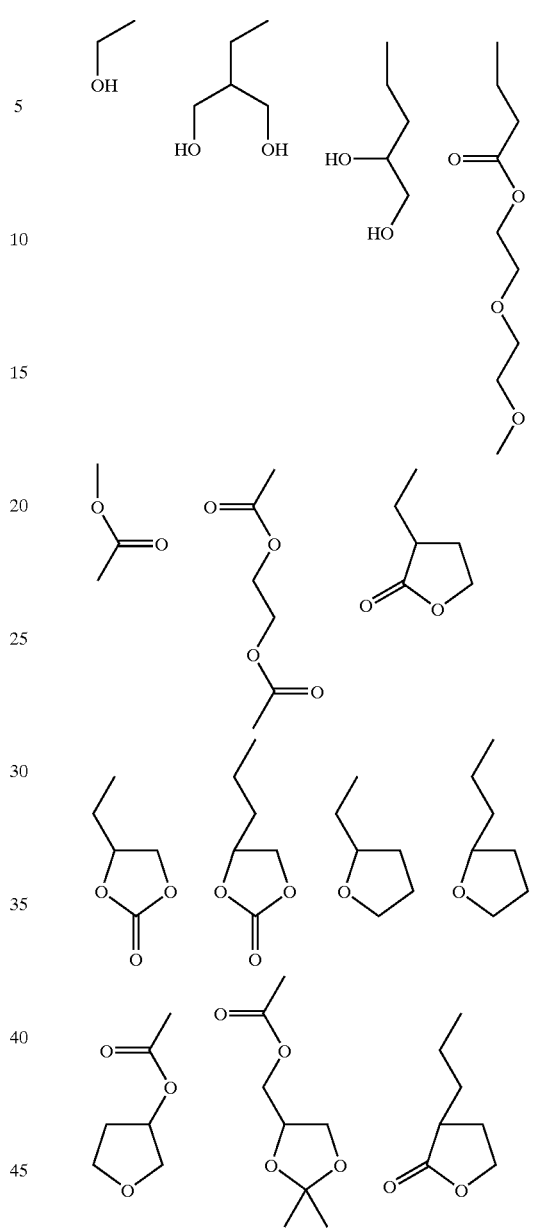
Where $R^7$ is an adhesive group, groups of the following formulae are preferred.
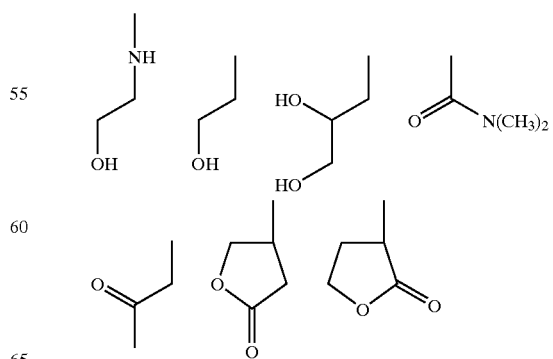

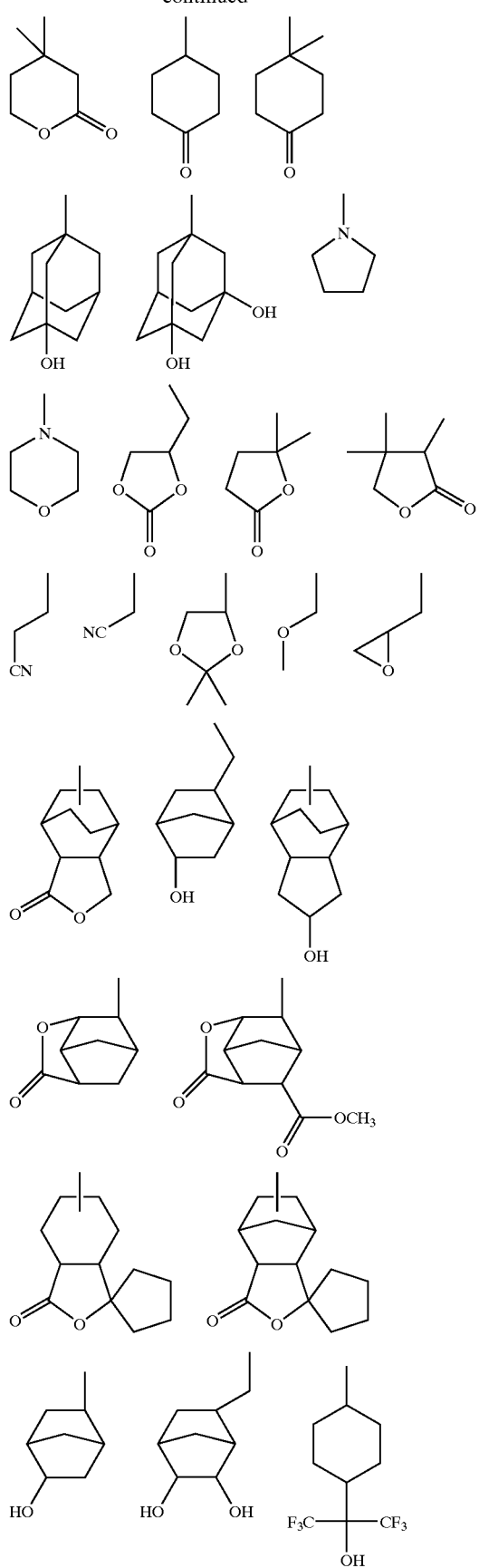
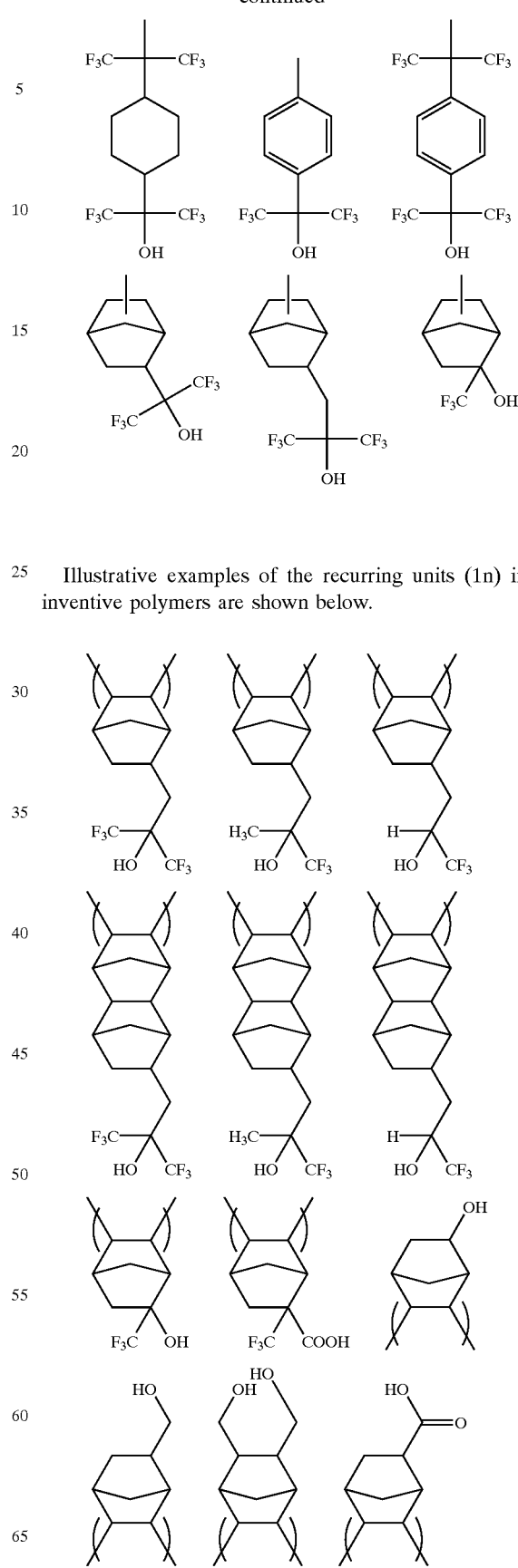
Illustrative examples of the recurring units (1n) in the inventive polymers are shown below.

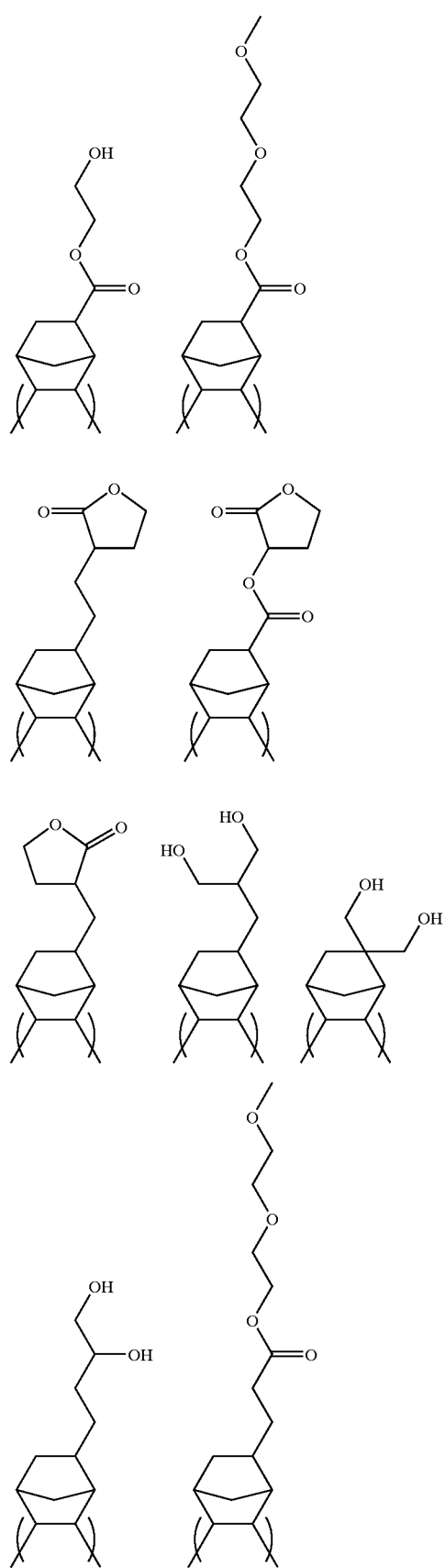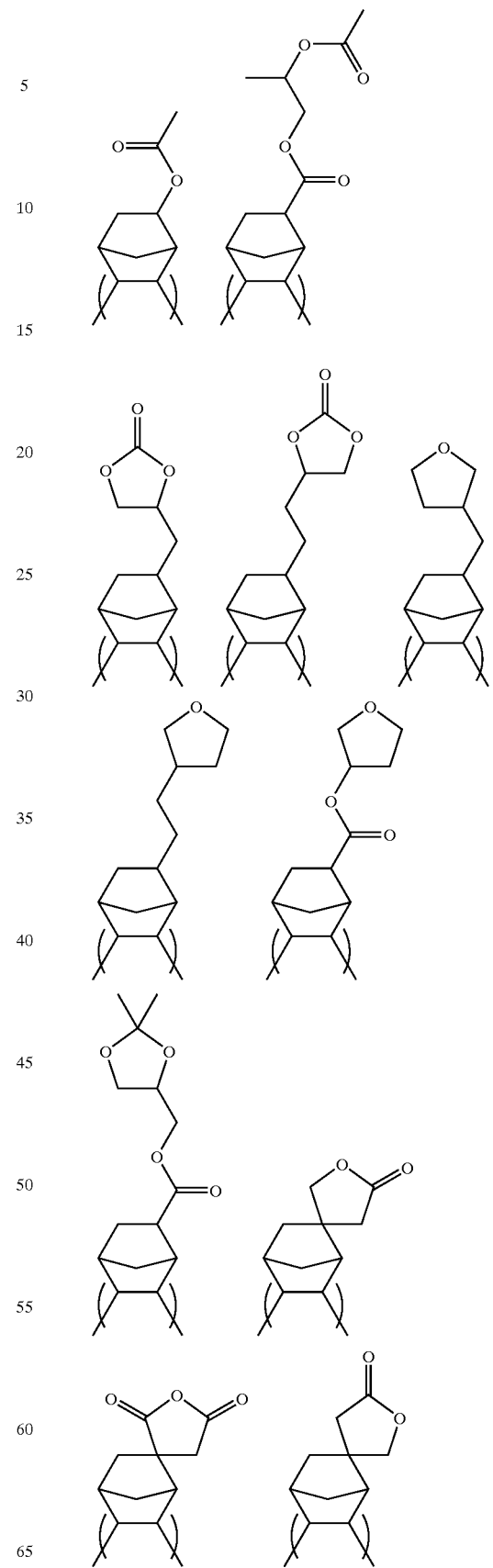

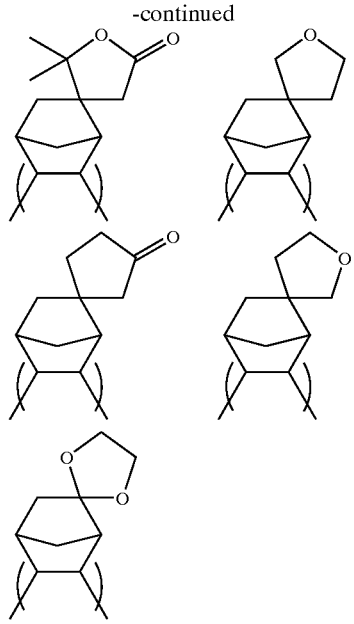
Illustrative examples of the recurring units (1p) are shown below.
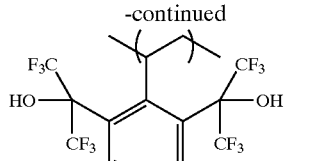
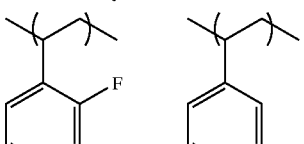
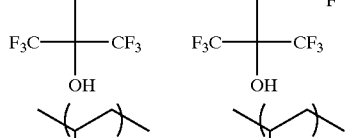
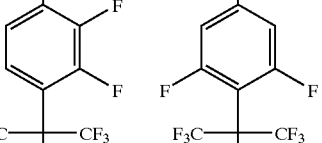
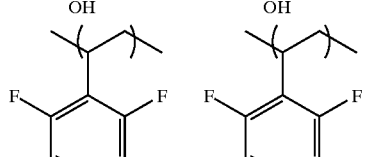
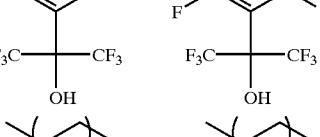
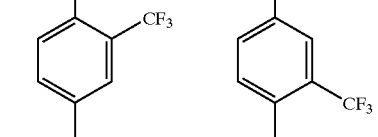
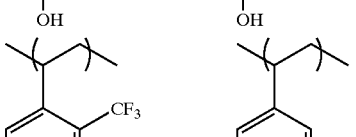
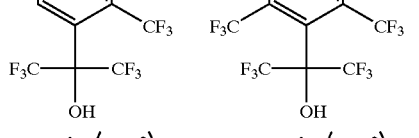
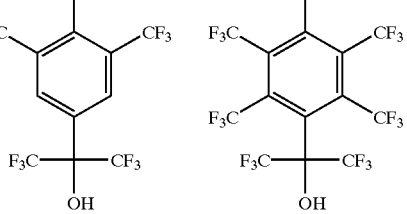

-continued
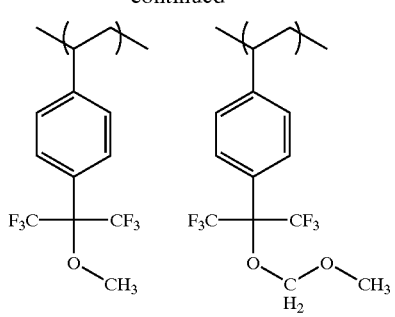
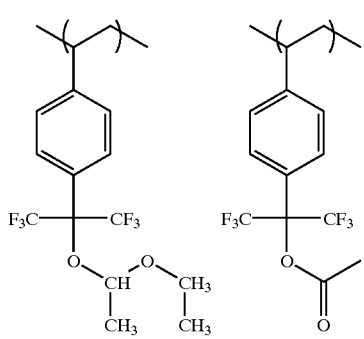
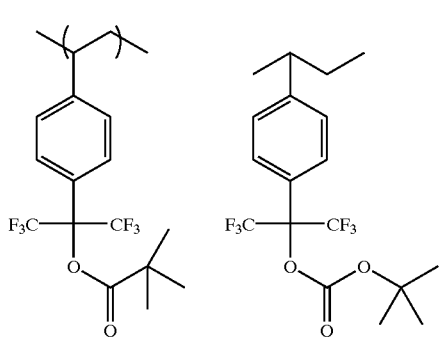
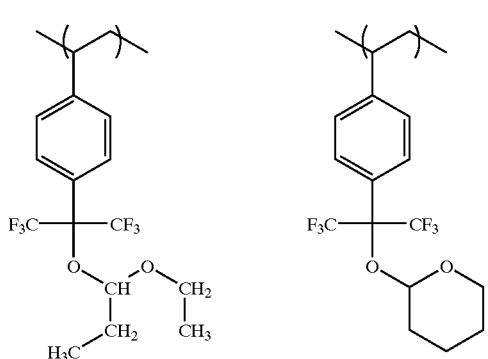
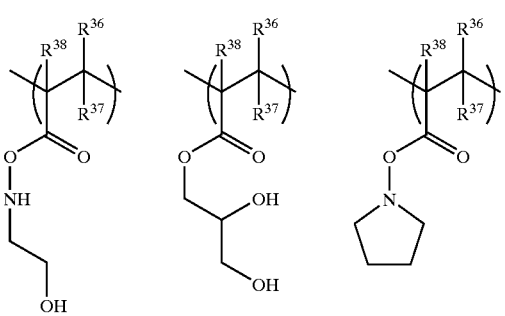
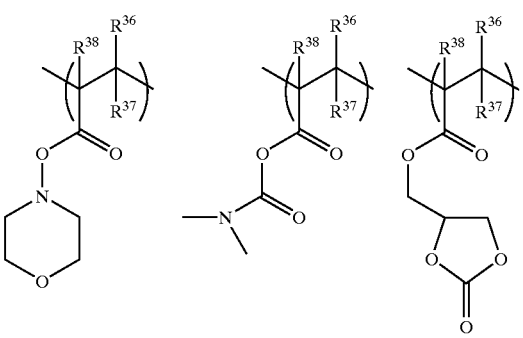
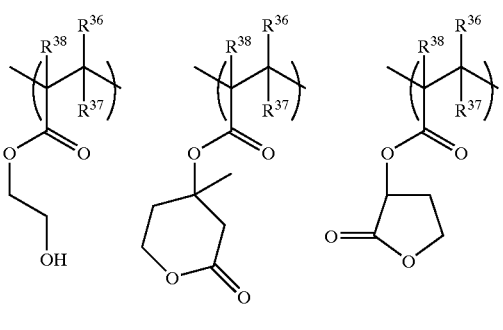
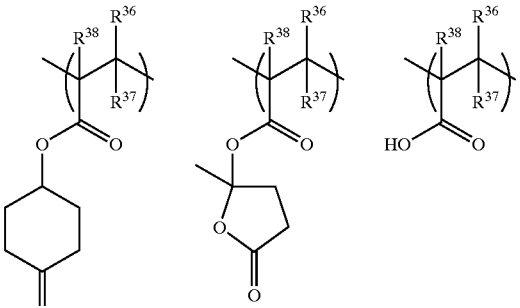
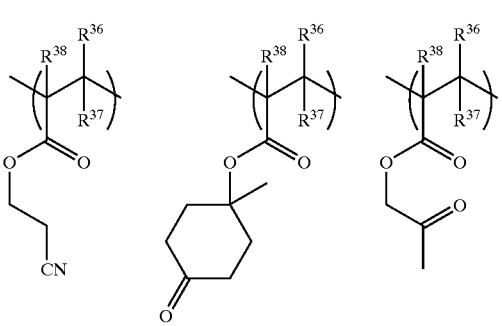
As described above, the polymers of the invention include recurring units (1m) originating from an acid-eliminatable monomer and recurring units (1n) or (1p) having an adhesive group. Any of the recurring units shown below may be copolymerized into the inventive polymers for further enhancing the adhesion.

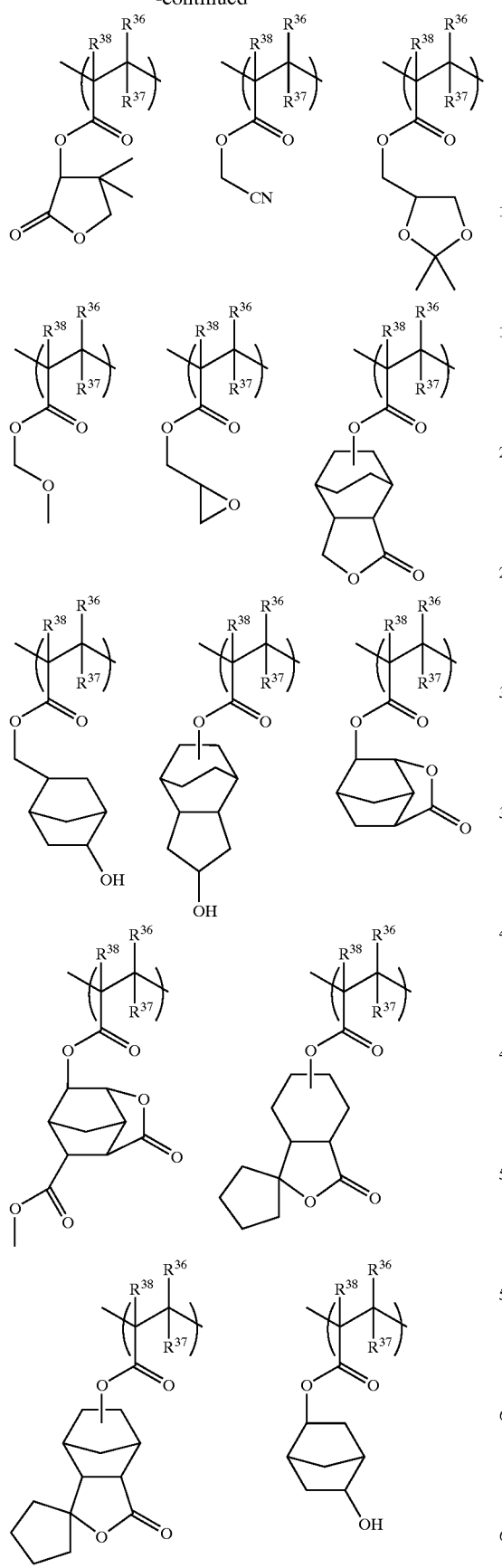
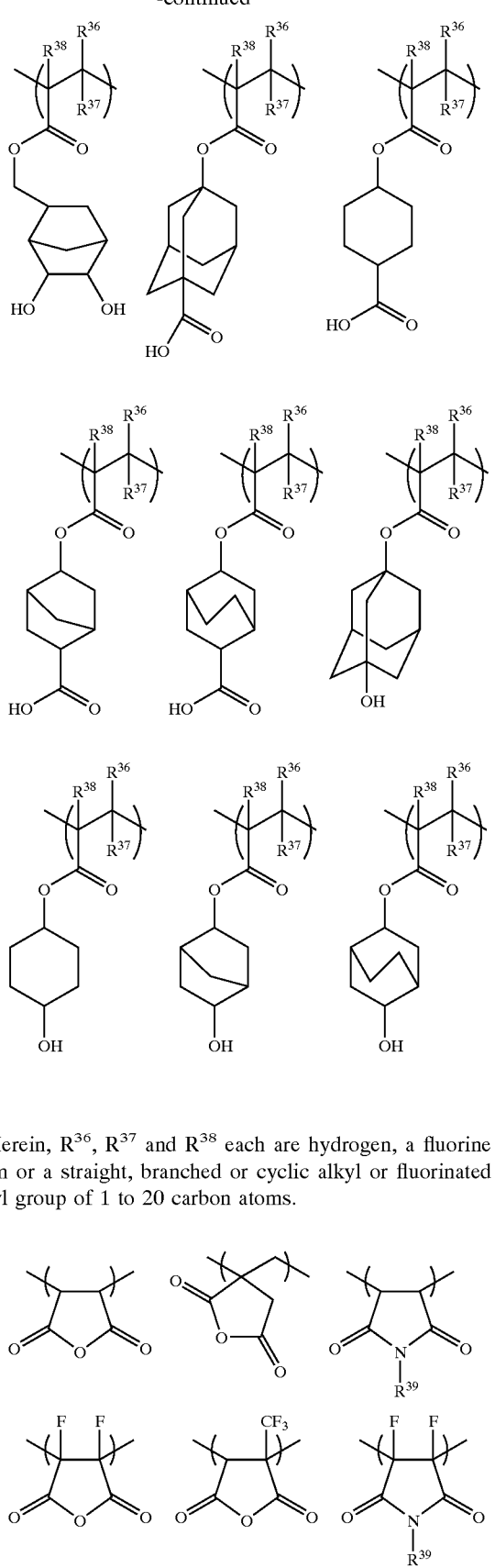
Herein, $R^{36}$, $R^{37}$ and $R^{38}$ each are hydrogen, a fluorine atom or a straight, branched or cyclic alkyl or fluorinated alkyl group of 1 to 20 carbon atoms.
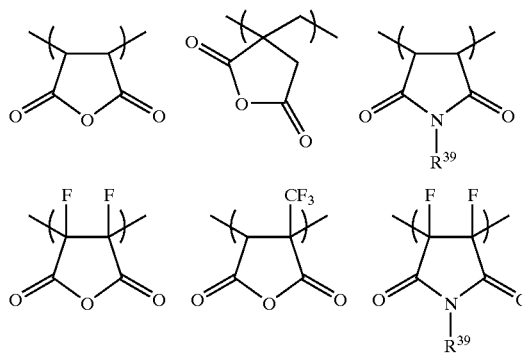

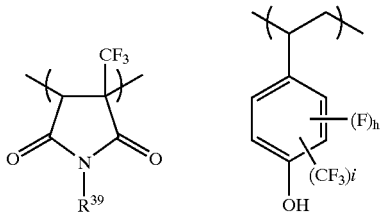

Herein, $R^{39}$ is hydrogen, hydroxyl or a straight, branched or cyclic alkyl group of 1 to 10 carbon atoms, h and i each are an integer of 0 to 4.

The inventive polymers may be binary copolymers of recurring units of α-trifluoromethylacrylate substituted with an acid labile group having a cyclic structure as the essential component with units of substituted or unsubstituted cycloolefin or styrene having a hexafluoro-alcohol pendant. They may also be ternary or more component copolymers of recurring units of α-trifluoromethylacrylic acid carboxylate substituted with an acid labile group having a cyclic structure as the essential component with units of substituted or unsubstituted cycloolefin having a hexafluoroalcohol pendant and units of styrene having a hexafluoroalcohol pendant. Blends of two or more polymers which differ in molecular weight, dispersity and/or copolymerization ratio are acceptable.

The polymer of the invention is generally synthesized by dissolving monomers corresponding to the respective units of formulae (1m), (1n) and (1p) and optionally, an adhesion-improving monomer as mentioned above in a solvent, adding a catalyst thereto, and effecting polymerization reaction while heating or cooling the system if necessary.

It is noted that the cycloolefin or styrene having a hexafluoroalcohol pendant may be subjected to polymerization in the hydroxyl group form. In another process, once the hydroxyl group is substituted with an acetyl group, the monomer is subjected to polymerization, and thereafter, the acetoxy group is eliminated using basic water. If the acetoxy group is left without elimination, it may be utilized as the adhesive group. In an alternative process, the cycloolefin or styrene having a hexafluoroalcohol pendant is treated with an acetal for substituting an ethoxyethoxy group for the hydroxyl group, the monomer is subjected to polymerization, and thereafter, the ethoxyethoxy group is eliminated using a weak acid. If the ethoxyethoxy group is left without elimination, it may be utilized as the acid labile group.

The polymerization reaction depends on the type of initiator or catalyst, trigger means (including light, heat, radiation and plasma), and polymerization conditions (including temperature, pressure, concentration, solvent, and additives). Commonly used for preparation of the polymer of the invention are radical polymerization of triggering polymerization with radicals of α,α'-azobis-isobutyronitrile (AIBN) or the like, and ion (anion) polymerization using catalysts such as alkyl lithium. These polymerization steps may be carried out in their conventional manner.

The radical polymerization initiator used herein is not critical. Exemplary initiators include azo compounds such as 2,2'-azobis(4-methoxy-2,4-dimethylvaleronitrile), 2,2'-azobis(2,4-dimethylvaleronitrile), 2,2'-azobisisobutyronitrile, and 2,2'-azobis(2,4,4-trimethylpentane); and peroxide compounds such as tert-butyl peroxypivalate, lauroyl peroxide, benzoyl peroxide and tert-butyl peroxylaurate. Water-soluble initiators include persulfate salts such as potassium persulfate, and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

Desirably the polymer has a weight average molecular weight of about 1,000 to about 1,000,000, and especially about 2,000 to about 100,000.

In formulae (1m), (1n) and (1p), m/(m+n) is preferably from 0.1 to 0.9, especially from 0.2 to 0.8; and m/(m+p) is preferably from 0.05 to 0.7, especially from 0.1 to 0.5.

It is noted that m+n or m+p is preferably from 0.3 to 1, more preferably from 0.5 to 1. In the case of m+n<1 or m+p<1, recurring units giving the adhesive group are added in a ratio q so as to satisfy m+n+q=1 or m+p+q=1.

The polymer of the invention can be used as a base resin in resist compositions, specifically chemical amplification type resist compositions, and especially chemical amplification type positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the above-defined polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluorocetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluoro-nonanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

Suitable examples of the photoacid generator (C) include onium salts of formula (2) below, diazomethane derivatives of formula (3), glyoxime derivatives of formula (4), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (2).

$(R^{51})_i M^+ K^-$ (2)

In the formula, $R^{51}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter i is 2 or 3.

Illustrative examples of alkyl groups represented by $R^{51}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Illustrative examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)-phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)-methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

The diazomethane derivatives used as the photoacid generator are of the general formula (3).

(3)

In the formula, $R^{52}$ and $R^{53}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{52}$ and $R^{53}$ include methyl, ethyl, propyl, butyl, amyl, cyclopentyl, cyclohexyl, norbornyl, and adamantyl.

Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

Examples of the diazomethane derivatives include bis(benzenesulfonyl)diazomethane, bis(p-toluenesulfonyl)-diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)-diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

The glyoxime derivatives used as the photoacid generator are of the general formula (4).

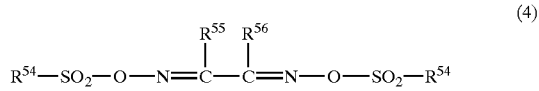
(4)

In the formula, $R^{54}$ to $R^{56}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{55}$ and $R^{56}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{54}$ to $R^{56}$ are exemplified by the same groups as mentioned above for $R^{52}$ and $R^{53}$. Examples of alkylene groups represented by $R^{55}$ and $R^{56}$ include methylene, ethylene, propylene, butylene, and hexylene.

Examples of the glyoxime derivatives include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime.

Other useful photoacid generators include β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)-diazomethane, bis(cyclohexylsulfonyl)diazomethane, bis(n-butylsulfonyl)diazomethane, bis(isobutylsulfonyl)-diazomethane, bis(sec-butylsulfonyl)diazomethane, bis(n-propylsulfonyl)diazomethane, bis(isopropylsulfonyl)-diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylaime, di-n-butylamine, di-iso-butylamine, di-sec-butylamine, dipentylamine, dicyclopentylamine, dihexylamine, dicyclohexylamine, dihetylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethlpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)-isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

In the formula, n is equal to 1, 2 or 3; the side chain Y is independently hydrogen or a straight, branched or cyclic alkyl group of 1 to 20 carbon atoms which may contain a hydroxyl group or ether; and the side chain X is independently selected from groups of the following general formulas (X)-1 to (X)-3, and two or three X's may bond together to form a ring.

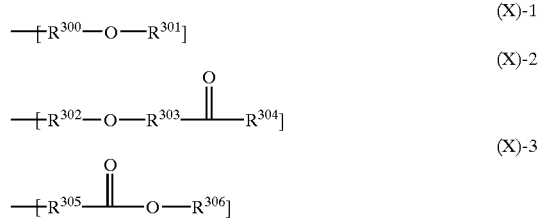

In the formulas, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)-ethyl}amine, tris{2-(1-methoxyethoxy)ethyl}amine, tris{2-(1-ethoxyethoxy)ethyl}amine, tris{2-(1-ethoxypropoxy)ethyl}-amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)-ethylamine, N,N-bis(2-acetoxyethyl)-2-(methoxycarbonyl)-ethylamine, N,N-bis(2-hydroxyethyl)-2-(ethoxycarbonyl)-ethylamine, N,N-bis(2-acetoxyethyl)-2-(ethoxycarbonyl)-ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl) ethylamine, N,N-bis(2-hydroxyethyl)-2-[(methoxycarbonyl)methoxycarbonyl] ethylamine, N,N-bis(2-acetoxyethyl)-2-[(methoxycarbonyl) methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl) ethylamine, N,N-bis(2-methoxyethyl)-2-(methoxycarbonyl) ethylamine, N-(2-hydroxyethyl)-bis[2-(methoxycarbonyl) ethyl]amine, N-(2-acetoxyethyl)-bis[2-(methoxycarbonyl) ethyl]amine, N-(2-hydroxyethyl)-bis[2-(ethoxycarbonyl) ethyl]amine, N-(2-acetoxyethyl)-bis[2-(ethoxycarbonyl) ethyl]amine, N-(3-hydroxy-1-propyl)-bis[2-(methoxycarbonyl)ethyl]amine, N-(3-acetoxy-1-propyl)-bis [2-(methoxycarbonyl)ethyl]amine, N-(2-methoxyethyl)-bis [2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris (methoxycarbonylmethyl)amine, tris (ethoxycarbonylmethyl)amine, N-butyl-bis (methoxycarbonylmethyl)amine, N-hexyl-bis (methoxycarbonylmethyl)amine, and β-(diethylamino)-δ-valerolactone.

Also useful are one or more of cyclic structure-bearing basic compounds having the following general formula (B)-2.

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]-piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)-propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

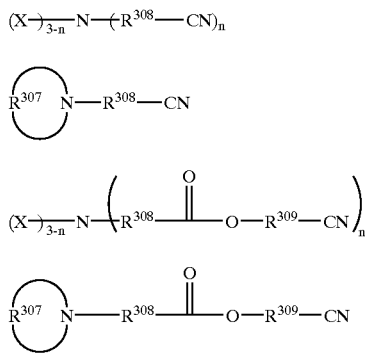

(B)-3

(B)-4

(B)-5

(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B)-3 to (B)-6 include 3-(diethylamino)propionitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3aminoprpiononitrile, diethlaminoacetonitrile, N,N-bis(2-hydroxyethyl)aminoacetonitrile, N,N-bis(2-acetoxyethyl)aminoacetonitrile, N,N-bis(2—formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)-ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 part of the basic compound may fail to achieve the desired effects thereof, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be either fluorinated ones contemplated herein or conventional fluorine-free ones.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl)-valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene] bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl) methylenebis(2,6-difluorophenol), 2,6-bis[(2-hydroxy-5-fluorophenyl)-methyl]-4-fluorophenol, 2,6-bis[(4-hydroxy-3-fluorophenyl)-methyl]-4-fluorophenol, and 2,4-bis[(3-hydroxy-4-hydroxyphenyl)methyl]-6-methylphenol. The acid labile substituents are the same as described above.

Illustrative, non-limiting, examples of the dissolution inhibitors which are useful herein include 3,3',5,5'- tetrafluoro[(1,1'-biphenyl)-4,4'-di-t-butoxycarbonyl], 4,4'-[2,2,2-trifluoro-1-(trifluoromethyl)-ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)-methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)-phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)-methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)-ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

The resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ laser (157 nm), $Kr_2$ laser (146 nm), KrAr excimer laser (134 nm) or $Ar_2$ laser (126 nm), x-rays, or an electron beam. The desired pattern may not be obtainable outside the upper and lower limits of the above range.

The resist composition comprising a copolymer of an acrylate monomer containing fluorine at α-position with a norbornene derivative or styrenic monomer having a hexafluoroalcohol pendant as a base resin according to the invention is sensitive to high-energy radiation, and has excellent sensitivity at a wavelength of up to 200 nm, especially up to 170 nm, significantly improved transmittance as well as satisfactory plasma etching resistance. These features of the inventive resist composition enable its use particularly as a resist having a low absorption at the exposure wavelength of a $F_2$ laser, and permit a finely defined pattern having sidewalls perpendicular to the substrate to be easily be formed, making the resist ideal as a micropatterning material in VLSI fabrication.

EXAMPLE

Examples of the invention are given below by way of illustration and not by way of limitation. The abbreviations used herein are AIBN for azobisisobutyronitrile, GPC for gel permeation chromatography, NMR for nuclear magnetic resonance, Mw for weight average molecular weight, and Mn for number average molecular weight. Mw/Mn is a molecular weight distribution or dispersity.

Synthesis Example 1

Copolymerization of Monomer 1 and Monomer 2 (7:3)

In a 500-ml flask, 28.8 g of Monomer 1 and 27.4 g of Monomer 2, both shown below, were dissolved in 100 ml of toluene. The system was fully purged of oxygen, charged with 0.33 g of the initiator AIBN, and heated at 60° C. at which polymerization reaction took place for 24 hours.

Monomer 1

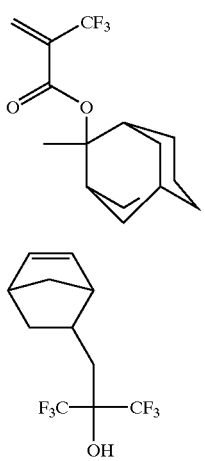

Monomer 2

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 44.1 g of a white polymer, which was found to have a Mw of 8,500 as measured by the light scattering method, and a dispersity (Mw/Mn) of 1.6 as determined from the GPC elution curve. On $^1$H-NMR analysis, the polymer was found to consist of Monomer 1 and Monomer 2 in a molar ratio of 68:32.

Synthesis Example 2
Copolymerization of Monomer 3 and Monomer 2 (7:3)

In a 500-ml flask, 26.2 g of Monomer 3 and 27.4 g of Monomer 2, both shown below, were dissolved in 100 ml of toluene. The system was fully purged of oxygen, charged with 0.33 g of the initiator AIBN, and heated at 60° C. at which polymerization reaction took place for 24 hours.

Monomer 3

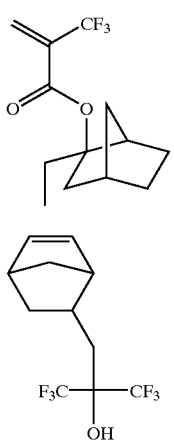

Monomer 2

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 40.2 g of a white polymer, which was found to have a Mw of 9,800 as measured by the light scattering method, and a dispersity (Mw/Mn) of 1.85 as determined from the GPC elution curve. On $^1$H-NMR analysis, the polymer was found to consist of Monomer 3 and Monomer 2 in a molar ratio of 72:28.

Synthesis Example 3
Copolymerization of Monomer 1 and Monomer 4 (2:8)

In a 500-ml flask, 11.6 g of Monomer 1 and 43.2 g of Monomer 4, both shown below, were dissolved in 100 ml of toluene. The system was fully purged of oxygen, charged with 0.33 g of the initiator AIBN, and heated at 60° C. at which polymerization reaction took place for 24 hours.

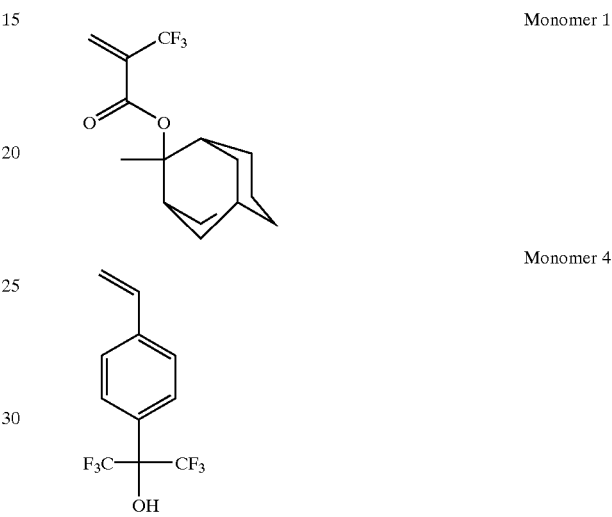

Monomer 1

Monomer 4

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 35.2 g of a white polymer, which was found to have a Mw of 12,100 as measured by the light scattering method, and a dispersity (Mw/Mn) of 1.75 as determined from the GPC elution curve. On $^1$H-NMR analysis, the polymer was found to consist of Monomer 1 and Monomer 4 in a molar ratio of 22:78.

Comparative Synthesis Example 1

Copolymerization of Monomer 5 and Monomer 2 (7:3)

In a 500-ml flask, 19.6 g of Monomer 5 and 27.2 g of Monomer 2, both shown below, were dissolved in 100 ml of toluene. The system was fully purged of oxygen, charged with 0.33 g of the initiator AIBN, and heated at 60° C. at which polymerization reaction took place for 24 hours.

Monomer 5

Monomer 2

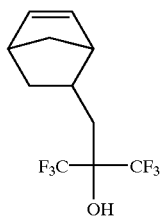

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 32.2 g of a white polymer, which was found to have a Mw of 9,500 as measured by the light scattering method, and a dispersity (Mw/Mn) of 1.78 as determined from the GPC elution curve. On $^1$H-NMR analysis, the polymer was found to consist of Monomer 5 and Monomer 2 in a molar ratio of 71:29.

Comparative Synthesis Example 2
Copolymerization of Monomer 5 and Monomer 4 (4:6)

In a 500-ml flask, 15.4 g of Monomer 5 and 32.4 g of Monomer 4, both shown below, were dissolved in 100 ml of toluene. The system was fully purged of oxygen, charged with 0.33 g of the initiator AIBN, and heated at 60° C. at which polymerization reaction took place for 24 hours.

Monomer 5

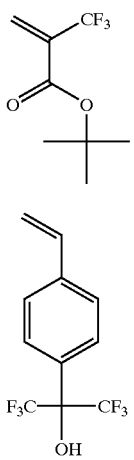

Monomer 4

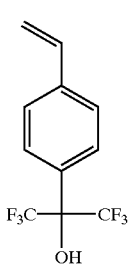

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 30.2 g of a white polymer, which was found to have a Mw of 12,800 as measured by the light scattering method, and a dispersity (Mw/Mn) of 1.73 as determined from the GPC elution curve. On $^1$H-NMR analysis, the polymer was found to consist of Monomer 5 and Monomer 4 in a molar ratio of 42:58.

For the sake of simplicity, the polymers obtained in Synthesis Examples 1–3 and Comparative Synthesis Examples 1–2 are designated Polymers 1–3 and Comparative Polymers 1–2, respectively.

Evaluation

Polymer Transmittance Measurement

Polymers 1–3 and Comparative Polymers 1–2 were determined for transmittance. Each polymer, 1 g, was thoroughly dissolved in 20 g of propylene glycol monomethyl ether acetate (PGMEA), and passed through a 0.2-μm filter, obtaining a polymer solution. The polymer solution was spin coated onto a MgF$_2$ substrate and baked on a hot plate at 100° C. for 90 seconds, forming a polymer film of 100 nm thick on the substrate. Using a vacuum ultraviolet spectrometer (VUV-200S by Nihon Bunko K.K.), the polymer film was measured for transmittance at 248 nm, 193 nm and 157 nm. The results are shown in Table 1.

TABLE 1

| | Transmittance (%) | | |
|---|---|---|---|
| | 248 nm | 193 nm | 157 nm |
| Polymer 1 | 99 | 99 | 58 |
| Polymer 2 | 99 | 90 | 60 |
| Polymer 3 | 99 | 13 | 50 |
| Comparative Polymer 1 | 99 | 90 | 60 |
| Comparative Polymer 2 | 99 | 15 | 50 |

Resist Preparation and Exposure

Resist solutions were prepared in a conventional manner by formulating the polymer, photoacid generator (PAG1 or PAG2), basic compound, dissolution inhibitor (DRI1) and solvent in the amounts shown in Table 2.

PAG1

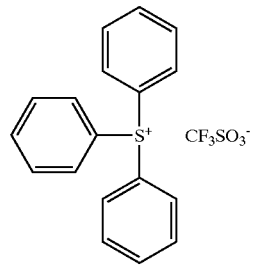

PAG2

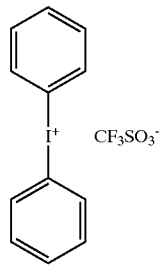

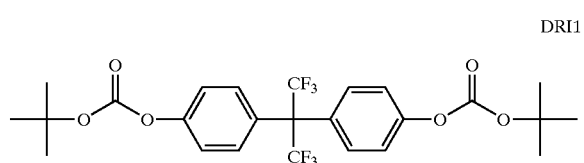
DRI1

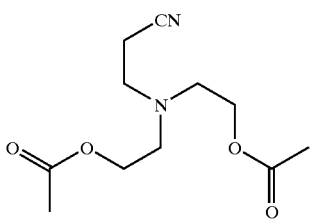
AACN

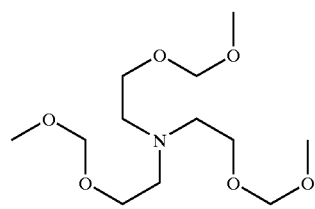
TMMEA

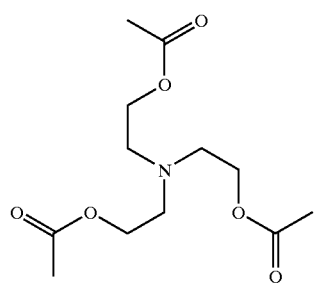
AAA

TBA: tributylamine
TEA: triethanolamine
PGMEA: propylene glycol monomethyl ether acetate On silicon wafers having a film of DUV-30 (Brewer Science) coated to a thickness of 55 nm, the resist solutions were spin coated, then baked on a hot plate at 100° C. for 90 seconds to give resist films having a thickness of 200 nm. The resist films were exposed by means of an $F_2$ laser (VUVES-4500 Lithotec Japan Co., Ltd.) while varying the exposure dose. Immediately after exposure, the resist films were baked at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) giving a film thickness 0 was determined. A γ value which was the slope (tan θ) of the characteristic curve was also determined. The results are shown in Table 2.

TABLE 2

| Polymer (pbw) | Photoacid generator (pbw) | Basic compound (pbw) | Dissolution inhibitor (pbw) | Solvent (pbw) | Eth, mJ/cm² | γ |
|---|---|---|---|---|---|---|
| Polymer 1 (100) | PAG1 (2) | TBA (0.1) | — | PGMEA (1,000) | 22 | 9.2 |
| Polymer 2 (100) | PAG1 (2) | TBA (0.1) | — | PGMEA (1,000) | 10 | 12.5 |
| Polymer 3 (100) | PAG1 (2) | TBA (0.1) | — | PGMEA (1,000) | 16 | 10.2 |
| Polymer 3 (100) | PAG1 (2) | TEA (0.1) | — | PGMEA (1,000) | 18 | 11.5 |
| Polymer 3 (100) | PAG1 (2) | TMMEA (0.1) | — | PGMEA (1,000) | 15 | 12.5 |
| Polymer 3 (100) | PAG1 (2) | AAA (0.1) | — | PGMEA (1,000) | 18 | 13.5 |
| Polymer 3 (100) | PAG1 (2) | AACN (0.1) | — | PGMEA (1,000) | 16 | 20.9 |
| Polymer 3 (100) | PAG1 (2) | TBA (0.1) | DRI1 (10) | PGMEA (1,000) | 13 | 8.5 |
| Polymer 3 (100) | PAG2 (2) | TBA (0.1) | — | PGMEA (1,000) | 7 | 11.5 |
| Comparative Polymer 1 (100) | PAG1 (2) | TEA (0.1) | — | PGMEA (1,000) | 55 | 4.2 |
| Comparative Polymer 2 (100) | PAG1 (2) | TEA (0.1) | — | PGMEA (1,000) | 44 | 6.8 |

Dry Etching Test Each of Polymers 1 to 3 and Comparative Polymers 1 to 2, 2 g, was thoroughly dissolved in 10 g of PGMEA, and passed through a 0.2-μm filter, obtaining a polymer solution. The polymer solution was spin coated onto a silicon substrate and baked, forming a polymer film of 300 nm thick. Dry etching tests were carried out on the polymer films by etching them under two sets of conditions. The results are shown in Table 3.

(1) Etching Test with $CHF_3/CF_4$ Gas

Using a dry etching instrument TE-8500P (Tokyo Electron K.K.), the difference in polymer film thickness before and after etching was determined.

| The etching conditions are given below. | |
| --- | --- |
| chamber pressure | 40.0 Pa |
| RF power | 1300 W |
| gap | 9 mm |
| $CHF_3$ gas flow rate | 30 ml/min |
| $CF_4$ gas flow rate | 30 ml/min |
| Ar gas flow rate | 100 ml/min |
| time | 60 sec |

(2) Etching Test with $Cl_2/BCl_3$ Gas

Using a dry etching instrument L-507D-L (Nichiden Anerba K.K.), the difference in polymer film thickness before and after etching was determined.

| The etching conditions are given below. | |
| --- | --- |
| chamber pressure | 40.0 Pa |
| RF power | 300 W |
| gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| time | 60 sec |

TABLE 3

| Polymer | $CHF_3/CF_4$ gas etching rate (nm/min) | $Cl_2/BCl_3$ gas etching rate (nm/min) |
| --- | --- | --- |
| Polymer 1 | 102 | 119 |
| Polymer 2 | 115 | 122 |
| Polymer 3 | 93 | 102 |
| Comparative Polymer 1 | 132 | 223 |
| Comparative Polymer 2 | 129 | 210 |

As is evident from Tables 1 and 2, resist compositions using polymers within the scope of the invention have a high transparency at the wavelength (157 nm) of the $F_2$ laser. It was also confirmed that upon exposure to VUV, these resist compositions exerted the positive working effect that the film thickness decreased with an increasing exposure dose. Table 3 indicates that polymers within the scope of the invention are highly resistant to dry etching.

Japanese Patent Application No. 2001-190680 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following general formulae (1m) and (1p):

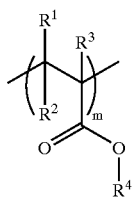

(1m)

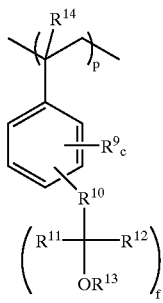

(1p)

wherein $R_1$ and $R^2$ each are hydrogen, a fluorine atom or a straight, branched or cyclic alkyl or fluorinated alkyl group of 1 to 20 carbon atoms, $R^3$ is a fluorine atom or a straight, branched or cyclic fluorinated alkyl group of 1 to 20 carbon atoms, $R^4$ is an acid labile group of one of the following, formulae

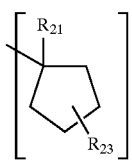 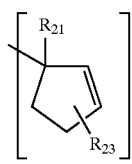

$R^{21}$ is a straight, branched or cyclic alkyl group of 1 to 6 carbon atoms which may contain a hetero atom, $R^{23}$ is hydrogen, hydroxyl, straight, branched or cyclic alkyl, hydroxyalkyl, alkoxyalkyl or alkoxy group of 1 to 6 carbon atoms, $R^9$ is hydrogen, a fluorine atom or a straight, branched or cyclic alkyl or fluorinated alkyl group of 1 to 20 carbon atoms, $R^{10}$ is a single bond or a divalent hydrocarbon group of 1 to 4 carbon atoms, $R^{11}$ and $R^{12}$ are each independently hydrogen, a fluorine atom or a straight, branched or cyclic alkyl or fluorinated alkyl group of 1 to 4 carbon atoms, at least either one of $R^{11}$ and $R^{12}$ contains at least one fluorine atom, $R^{13}$ is hydrogen, a straight, branched or cyclic alkyl group of 1 to 10 carbon atoms or an acid labile group, $R^{14}$ is hydrogen, a fluorine atom or a straight or branched alkyl or fluorinated alkyl group of 1 to 4 carbon atoms, m and p each are a number from more than 0 to less than 1, and $0<m+p\leq1$, e is an integer of 0 to 4, and f is an integer of 1 to 3.

2. The polymer of claim 1 wherein $R^3$ is a straight, branched or cyclic fluorinated alkyl group of 1 to 20 carbon atoms.

3. The polymer of claim 2 wherein $R^3$ is trifluoromethyl.

4. A resist composition comprising the polymer of claim 1.

5. A process for forming a resist pattern comprising the steps of:

applying the resist composition of claim 4 onto a substrate to form a coating, heat treating the coating and then exposing it to high-energy radiation in a wavelength band of 100 to 180 nm or 1 to 30 mn through a photo mask, and optionally heat treating the exposed coating and developing it with a developer.

6. The pattern forming process of claim 5 wherein the high-energy radiation is an $F_2$ laser beam, $Ar_2$ laser beam or soft x-ray.

7. A chemically amplified resist composition comprising (A) the polymer of claim 1, (B) an organic solvent, and (C) a photoacid generator.

8. The resist composition of claim 7 further comprising (D) a basic compound.

9. The resist composition of claim 7 further comprising (E) a dissolution inhibitor.

10. A resist pattern that has been formed from a polymer according to claim 1.

11. The polymer of claim 1, wherein $R^3$ is a straight, branched or cyclic fluorinated alkyl group of 1 to 12 carbon atoms.

12. The polymer of claim 1, wherein $R^9$ is a straight, branched or cyclic alkyl or fluorinated alkyl group of 1 to 12 carbon atoms.

13. The polymer of claim 12, wherein $R^3$ is trifluoromethyl.

14. The polymer of claim 1, wherein $R^{10}$ is an alkylene group.

15. The polymer of claim 1, wherein recurring units of (1p) is selected from the group consisting of

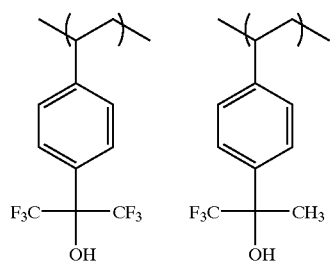

-continued

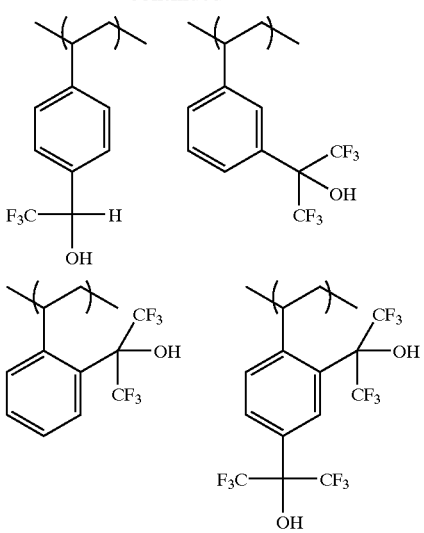

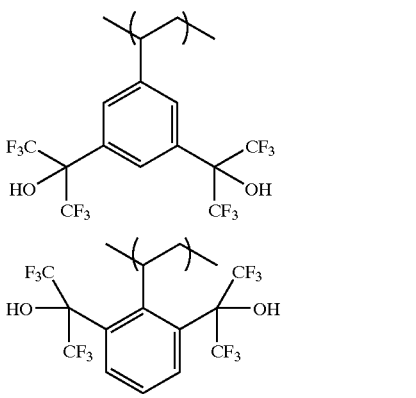

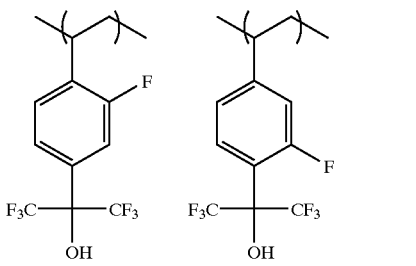

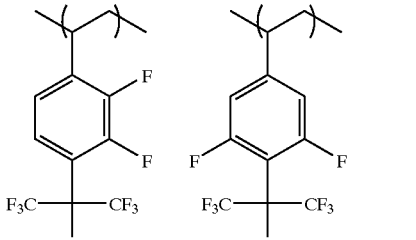

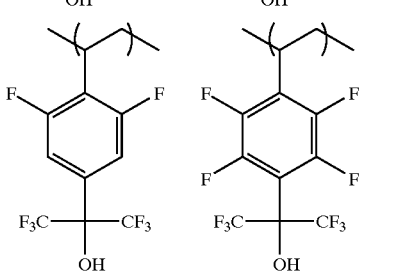

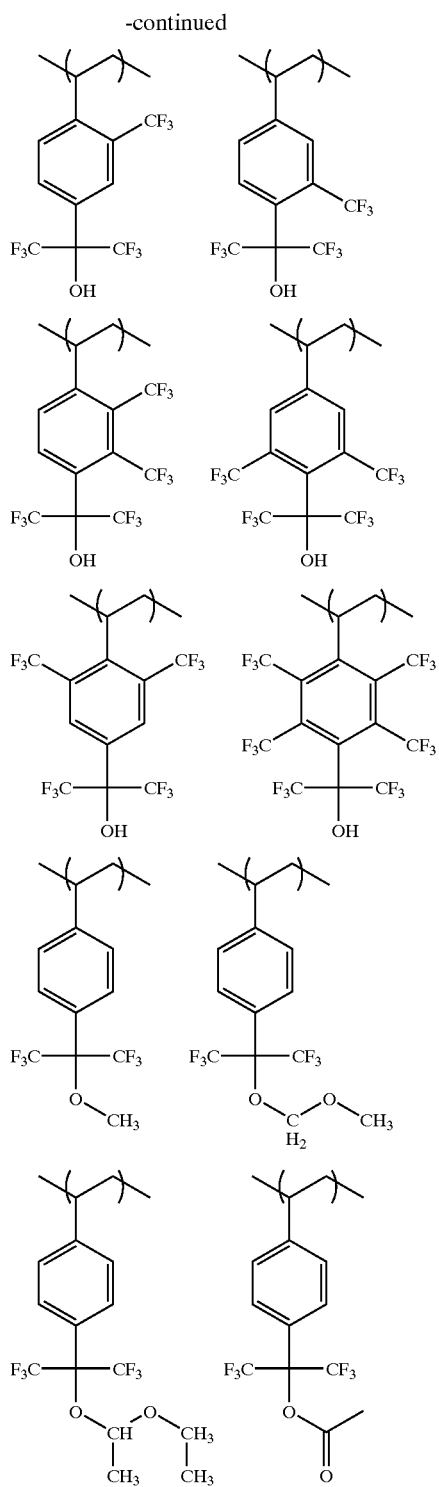
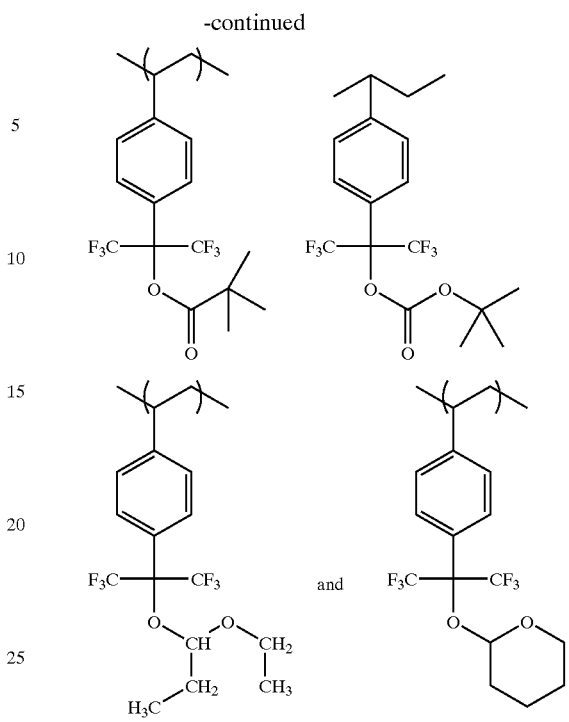

16. A chemically amplified resist composition comprising (A) the polymer of claim 15, (B) an organic solvent, and (C) a photoacid generator.

17. A process for forming a resist pattern comprising the steps of:

applying the resist composition of claim 16 onto a substrate to form a coating, heat treating the coating and then exposing it to high-energy radiation in a wavelength band of 100 to 180 nm or 1 to 30 nm through a photo mask, and optionally heat treating the exposed coating and developing it with a developer.

18. A resist pattern that has been formed from a polymer according to claim 15.

* * * * *